(12) United States Patent
Howard et al.

(10) Patent No.: US 7,119,542 B1
(45) Date of Patent: Oct. 10, 2006

(54) AZIMUTHALLY-ORIENTING NMR SAMPLES

(75) Inventors: Layne E. Howard, Los Gatos, CA (US); Fabian M. van de Graaf, Fremont, CA (US); Arthur V. Mesina, Mountain View, CA (US)

(73) Assignee: Varian, Inc., Palo Alto, CA (US)

( * ) Notice: Subject to any disclaimer, the term of this patent is extended or adjusted under 35 U.S.C. 154(b) by 153 days.

(21) Appl. No.: 11/102,518

(22) Filed: Apr. 8, 2005

(51) Int. Cl.
*G01V 3/00* (2006.01)
(52) U.S. Cl. ..................................... 324/321
(58) Field of Classification Search ............... 324/321, 324/318
See application file for complete search history.

(56) References Cited

U.S. PATENT DOCUMENTS

| | | | | |
|---|---|---|---|---|
| 3,991,627 A | | 11/1976 | Laird et al. | |
| 4,088,944 A | * | 5/1978 | Engler et al. | 324/321 |
| 4,268,477 A | * | 5/1981 | Herzstark | 422/64 |
| 5,517,856 A | * | 5/1996 | Hofmann et al. | 324/321 |
| 6,396,274 B1 | * | 5/2002 | Commens et al. | 324/321 |
| 6,917,201 B1 | * | 7/2005 | de Swiet | 324/321 |

* cited by examiner

*Primary Examiner*—Louis M. Arana
(74) *Attorney, Agent, or Firm*—Bella Fishman; Andrei Popovici (57) ABSTRACT

In some embodiments, a nuclear magnetic resonance (NMR) sample container having an elongated transverse cross-section is held in a predetermined azimuthal orientation in an NMR probe by keying-in a sample container holder into a matching azimuthal-alignment adapter. The azimuthal-alignment adapter may be a lead-in adapter having an azimuthally-sloping upper guiding surface of a cylindrical shell part, with the sloping guiding surface leading into a longitudinal channel defined through the shell wall. A transversely-protruding pin of the sample container holder slides down the guiding surface and into the longitudinal channel to lock the sample in the desired azimuthal orientation.

18 Claims, 6 Drawing Sheets

AZIMUTHALLY-ORIENTING NMR SAMPLES

BACKGROUND OF THE INVENTION

The invention relates to nuclear magnetic resonance (NMR) spectroscopy, and in particular to systems and methods for positioning NMR samples in NMR spectrometers.

Nuclear magnetic resonance (NMR) spectrometers typically include a superconducting magnet for generating a static magnetic field $B_0$, and an NMR probe including one or more special-purpose radio-frequency (RF) coils for generating a time-varying magnetic field $B_1$ perpendicular to the field $B_0$, and for detecting the response of a sample to the applied magnetic fields. Each RF coil and associated circuitry can resonate at the Larmor frequency of a nucleus of interest present in the sample. The direction of the static magnetic field $B_0$ is commonly denoted as the z-axis or longitudinal direction, while the plane perpendicular to the z-axis is commonly termed the x-y or transverse direction. The RF coils are typically provided as part of an NMR probe, and are used to analyze samples situated in sample tubes or flow cells.

In a commonly-used approach, NMR sample tubes are spun at high speeds (e.g. at a frequency of several kHz) during measurements in order to achieve narrower spectral linewidths. Spinning the samples causes the NMR measurements to reflect an azimuthal averaging of gradients and inhomegeneities in the magnetic fields applied to the samples. For solid polycrystalline samples, spinning also allows azimuthally averaging over the various crystalline orientations present in the sample. For solid samples, optimal spectra can be achieved when the angle between the spinning axis (the longitudinal sample axis) and the direction of the static magnetic field is the "magic angle," or about 54°. The magic angle is the solution to the equation $3\cos^2\theta - 1 = 0$. Liquid or gaseous samples are typically spun about an axis coinciding with the direction of the static magnetic field.

In U.S. Pat. No. 3,991,627, Laird et al. describe a device for longitudinally aligning sample containers such as test tubes regardless of the containers' size. The device comprises a foot member provided with a tapered cavity for receiving the bottom end of the container, a holder for holding the other end of the container in a temporary position, and a head member having a tapered cavity for receiving the other or upper end of the container. The foot and head members are movable relative to one another so that the cavity of the head member can releasably engage the upper end of the container and align the container with a predetermined longitudinal axis.

SUMMARY OF THE INVENTION

According to one aspect, a nuclear magnetic resonance apparatus comprises a sample container holder comprising a generally-transverse azimuthal-alignment protrusion, and a lead-in adapter comprising an azimuthally-sloping guiding surface leading into a generally-longitudinal azimuthal-alignment channel matching the azimuthal-alignment protrusion. The sample container holder holds a nuclear magnetic resonance sample container in a nuclear magnetic resonance probe. The sloping guiding surface leads the azimuthal-alignment protrusion into the azimuthal-alignment channel to orient the nuclear magnetic resonance sample container in a predetermined azimuthal orientation within the nuclear magnetic resonance probe.

According to another aspect, a nuclear magnetic resonance apparatus comprises a nuclear magnetic resonance probe azimuthal-orientation adapter; and a sample container holder keyed into the azimuthal-orientation adapter, for holding a nuclear magnetic resonance sample container in a predetermined azimuthal orientation within a nuclear magnetic resonance probe.

According to another aspect, a lead-in adapter for azimuthally orienting a nuclear magnetic resonance sample tube in a nuclear magnetic resonance probe comprises a longitudinal shell having an azimuthally-sloping guiding surface leading into a generally-longitudinal azimuthal-alignment channel sized to engage an azimuthal-alignment protrusion of a nuclear magnetic resonance sample holder.

According to another aspect, a nuclear magnetic resonance method comprises positioning a nuclear magnetic resonance sample container in a predetermined azimuthal orientation in a nuclear magnetic resonance probe by keying-in a sample container holder holding the sample container into a nuclear magnetic resonance probe azimuthal-orientation adapter; and performing a nuclear magnetic resonance measurement on a sample contained in the sample container positioned in the azimuthal orientation.

BRIEF DESCRIPTION OF THE DRAWINGS

The foregoing aspects and advantages of the present invention will become better understood upon reading the following detailed description and upon reference to the drawings where:

FIG. 2-A shows an isometric view of an NMR probe assembly including a sample container holder, a sample container, and an azimuthal-orientation lead-in adapter according to some embodiments of the present invention.

FIG. 2-B shows an isometric view of the azimuthal-orientation adapter of FIG. 2-A.

FIG. 2-C shows an isometric view of the sample container holder of FIG. 2-A.

FIG. 2-D shows a longitudinal sectional view of the sample container holder and sample container of FIG. 2-A.

FIG. 2-E shows the NMR probe assembly of FIG. 2-A mounted on an NMR probe support, according to some embodiments of the present invention.

FIG. 3-A shows an isometric view of an NMR probe assembly including a sample container holder, a sample container, and an azimuthal-orientation adapter having multiple channels, according to some embodiments of the present invention.

FIG. 3-B shows an isometric view of the azimuthal-orientation adapter of FIG. 3-A.

FIG. 3-C shows an isometric view of the sample container holder of FIG. 3-A.

FIG. 3-D shows a longitudinal sectional view of the sample container holder and sample container of FIG. 3-A.

DETAILED DESCRIPTION OF THE INVENTION

In the following description, a set of elements includes one or more elements. Any reference to an element is understood to encompass one or more elements. Each recited element or structure can be formed by or be part of a monolithic structure, or be formed from multiple distinct structures. The statement that a coil is used to perform a nuclear magnetic measurement on a sample is understood to mean that the coil is used as transmitter, receiver, or both. Unless otherwise stated, any recited electrical or mechanical connections can be direct connections or indirect connections through intermediary structures. Unless otherwise specified, the statement that a first part is keyed into a second part encompasses, among others and without limitation, configurations in which the first part is male and the second female, and configurations in which the first part is female and the second male.

The following description illustrates embodiments of the invention by way of example and not necessarily by way of limitation.

Figure 1:
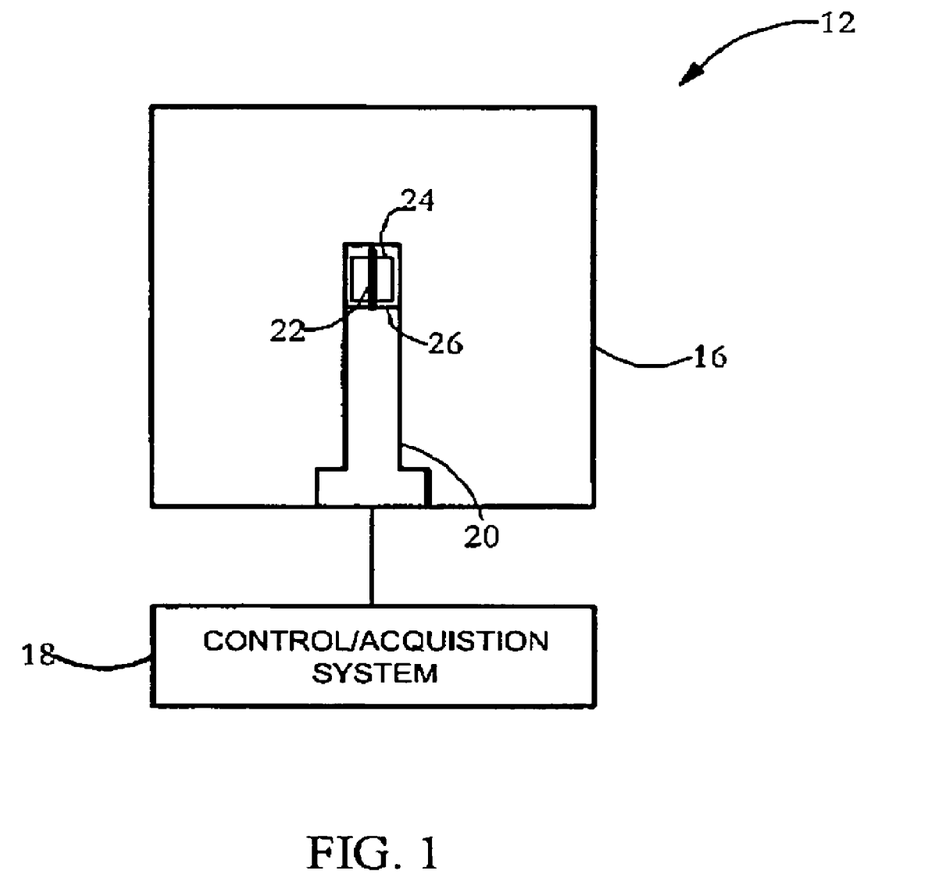
FIG. 1 is a schematic diagram of an exemplary NMR spectrometer according to some embodiments of the present invention.

FIG. 1 is a schematic diagram illustrating an exemplary nuclear magnetic resonance (NMR) spectrometer 12 according to some embodiments of the present invention. Spectrometer 12 comprises a magnet 16, an NMR probe 20 inserted in a cylindrical bore of magnet 16, and a control/acquisition system 18 electrically connected to magnet 16 and probe 20. Probe 20 includes one or more radio-frequency (RF) coils 24 and associated electrical circuit components. For simplicity, the following discussion will focus on a single coil 24, although it is understood that a system may include multiple nested RF coils. A sample container 22 is positioned within probe 20, for holding an NMR sample of interest within coil 24 while measurements are performed on the sample. Sample container 22 can be a sample tube or a flow cell. Coil 24 is disposed above a lower insulator 26, which includes a number of longitudinal apertures for passing various electrical connection therethrough. A number of electrical circuit components such as capacitors, inductors, and other components are disposed below lower insulator 26 and are electrically connected to coil 24. Coil 24 and the various components connected to coil 24 form one or more NMR measurement circuits. Probe 20 includes additional conventional components, such as shim coils used to correct spatial inhomogeneities in the static magnetic field $B_0$.

To perform a measurement, a sample is inserted into a measurement space defined within coil 24. Magnet 16 applies a static magnetic field $B_0$ to the sample held within sample container 22. Control/acquisition system 18 comprises electronic components configured to apply desired radio-frequency pulses to probe 20, and to acquire data indicative of the nuclear magnetic resonance properties of the samples within probe 20. Coil 24 is used to apply radio-frequency magnetic fields $B_1$ to the sample, and/or to measure the response of the sample to the applied magnetic fields. The RF magnetic fields are perpendicular to the static magnetic field. The same coil may be used for both applying an RF magnetic field and for measuring the sample response to the applied magnetic field. Alternatively, one coil may be used for applying an RF magnetic field, and another coil for measuring the response of the sample to the applied magnetic field.

Figure 2:
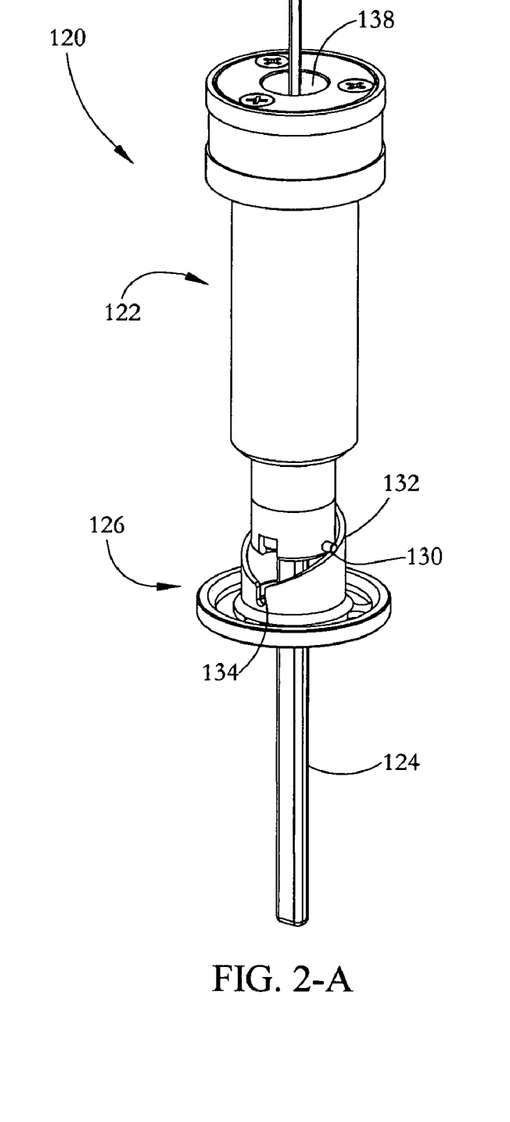

FIG. 2-A shows an isometric view of part of an NMR probe assembly 120 including a sample container holder 122, a sample container 124, and an azimuthal-orientation, lead-in adapter 126, according to some embodiments of the present invention. FIG. 2-B shows lead-in adapter 126, while FIG. 2-C shows holder 122. When a sample is to be placed in an NMR probe in a desired azimuthal orientation, the assembly formed by holder 122 and sample container 124 is dropped in any azimuthal orientation onto lead-in adapter 126, and is guided by lead-in adapter 126 to a keyed-in position corresponding to the desired azimuthal orientation of sample container 124, as described below.

The sample container 124 shown in FIG. 2-A is a sample tube, but generally sample container 124 may be a flow cell. In the illustrated embodiment, sample container 124 has an elongated, rectangular transverse cross-section. Sample container holder 122 is generally longitudinal, and includes a transversely-protruding cylindrical pin 130 extending away from the lateral surface of holder 122 along a lower end region of holder 122. Cylindrical pin 130 is sized to rest on an azimuthally-sloping guiding (lead-in) surface 132 of lead-in adapter 126. Surface 132 is the top surface of a cylindrical shell part 140 having an inner bore 148, shown in FIG. 2-B. Without pin 130, the lower end region of holder 122 would slide freely through inner bore 148. Pin 130 constrains the motion of holder 122 to follow a downward spiraling path as pin 130 slides down guiding surface 132. The bottom part of guiding surface 132 leads into a longitudinal channel 134 sized to produce a sliding fit around pin 130. As illustrated, longitudinal channel 134 extends through the entire transverse extent of the lead-in adapter shell part 140. In some embodiments, longitudinal channel 134 may be formed along an inner surface of lead-in adapter 126.

Lead-in adapter 126 has a lower mounting/azimuthal adjustment lip 142 transversely-protruding outside shell part 140. Mounting lip 142 has a plurality of generally-arcuate, azimuthal adjustment apertures 144 extending from the top side to the bottom side of mounting lip 142. Each azimuthal-adjustment aperture 144 accommodates a corresponding longitudinal fastener such as a screw 158, as shown in FIG. 2-E. The longitudinal fasteners are used to secure lead-in adapter 126 to a probe casing or support 160, for example an upper probe end. The azimuthal position of lead-in adapter 126 within the probe can be adjusted by controlling the azimuthal position of each fastener 158 within its corresponding adjustment aperture 144. In some embodiments, to azimuthally-align lead-in adapter, lead-in adapter 126 is positioned loosely on top of casing 160 while holding a holder/sample container assembly, and while one or more RF coils within the probe are connected to test equipment. The assembly containing lead-in adapter 126 is rotated until a recorded test signal indicates that lead-in adapter 126 is in the desired azimuthal orientation. Fasteners 158 are then tightened to secure lead-in adapter 126 in that orientation.

FIG. 2-D shows a longitudinal sectional view of the assembly formed by sample container holder 122 and sample container 124. Sample container 124 comprises a generally-longitudinal, tubular outer wall having an elongated transverse cross-section (not shown). A sample measurement volume 170 for holding a liquid sample of interest is defined between a lower susceptibility-compensated plug 172 and an upper susceptibility-compensated plug 174. Plug 174 comprises a longitudinal handle extending upward to outside sample container 124 and holder 122. Sample measurement volume 170 is positioned below holder 122.

Sample container 124 is held within holder 122 by O-ring keepers 188, 194 and two adjacent O-rings 186, 196, respectively. Sample holder 122 comprises an outer casing 180 comprising a lower, middle, and upper regions 180a–c having progressively larger outer diameters. A lower extension 190 is connected at the bottom of lower region 180a, and presses O-ring 196 onto O-ring keeper 194. Pin 130 is secured through lower extension 190. An upper plug 182 is connected at the top of upper region 180c, and extends within middle region 180b to press O-ring 186 onto O-ring keeper 188. A sample assembly cap 184 positioned over sample container 124 reduces sample evaporation and supports the longitudinal handle of plug 174 in place.

Figure 3:
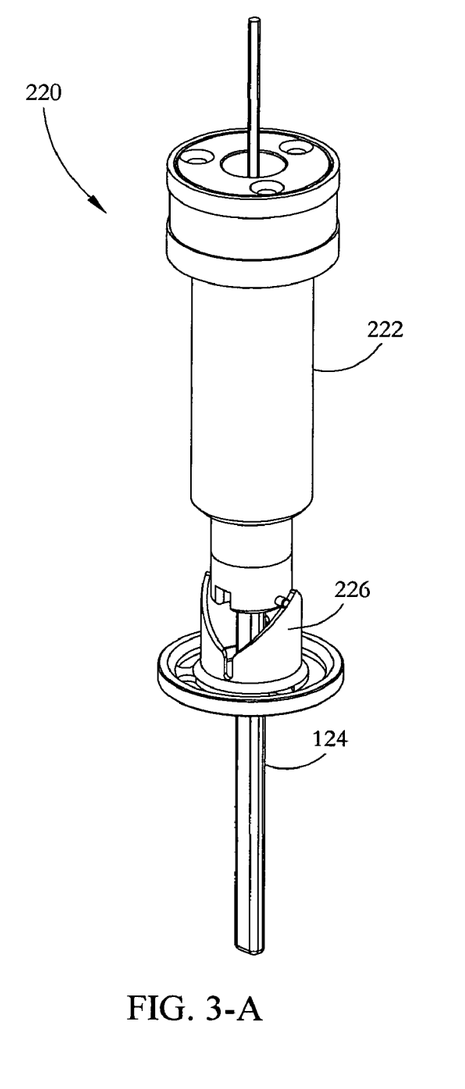

FIG. 3-A shows an isometric view of a part of an NMR probe assembly 220 including a sample container holder 222, a sample container 124, and an azimuthal-orientation adapter 226 having multiple channels, according to some embodiments of the present invention. FIGS. 3-B and 3-C show isometric views of adapter 226 and the assembly formed by holder 222 and sample container 124, respectively. Holder 222 comprises two oppositely-spaced alignment pins 230a–b sized to slide into corresponding channels 234a–b defined in adapter 226. Pins 230a–b are arranged in an azimuthal pattern matching the azimuthal pattern of channels 234a–b. In the embodiment shown in FIG. 3-A, there are two permissible azimuthal orientations for sample container 124 within the NMR probe. In some embodiments, it may be desirable to only allow one permissible orientation, as in the configuration shown in FIGS. 2-A–D, particularly if small variations in material thicknesses or geometries between the two orientations affect the spectrometer's operation.

In some embodiments, the sample container holder, including the guiding pin(s), is made of materials such as Delrin, an acetal (polyoxymethylene), or G10, a glass-filled resin, while the lead-in adapter is formed from a harder material such as silicon bronze. Using a more wear-resistant material for the lead-in adapter than for the holder pins allows most wear to occur on the pins, rather than the less accessible lead-in adapter.

The above embodiments may be altered in many ways without departing from the scope of the invention. In some embodiments, the illustrated male and female geometries are reversed. For example, a protrusion may be provided in the adapter, and a guiding surface or channel can be provided in the sample container holder. More than two pins/channels can be provided, in a regular or irregular azimuthal pattern. Various other key-in shapes can be used to mate the adapter and holder in a desired azimuthal orientation. Similarly, protrusions of various shapes can be used for the mating. Guiding surfaces having non-linear slopes (e.g. concave or convex) can be used. Accordingly, the scope of the invention should be determined by the following claims and their legal equivalents.

What is claimed is:

1. A nuclear magnetic resonance apparatus comprising:
   a sample container holder comprising a generally-transverse azimuthal-alignment protrusion, the sample container holder holding a nuclear magnetic resonance sample container in a nuclear magnetic resonance probe; and
   a lead-in adapter comprising an azimuthally-sloping guiding surface leading into a generally-longitudinal azimuthal-alignment channel matching the azimuthal-alignment protrusion, the guiding surface leading the azimuthal-alignment protrusion into the azimuthal-alignment channel, the channel orienting the nuclear magnetic resonance sample container in a predetermined azimuthal orientation within the nuclear magnetic resonance probe.

2. The apparatus of claim 1, wherein:
   the sample container holder comprises a plurality of generally-transverse azimuthal-alignment protrusions arranged in a first azimuthal pattern; and
   the lead-in adapter comprises a plurality of generally-longitudinal azimuthal-alignment channels arranged in the first azimuthal pattern.

3. The apparatus of claim 1, wherein the azimuthal-alignment protrusion is a cylindrical pin having an outer diameter matching a width of the azimuthal-alignment channel.

4. The apparatus of claim 1, wherein the sample container holder comprises an inner longitudinal bore holding the nuclear magnetic resonance sample container therein.

5. The apparatus of claim 1, wherein the sample container has an elongated transverse-cross-sectional shape.

6. The apparatus of claim 1, wherein the lead-in adapter comprises an azimuthal-adjustment lip protruding transversely outside the guiding surface, the azimuthal-adjustment lip allowing an adjustment of a mounting of the lead-in adapter in the nuclear magnetic resonance probe.

7. The apparatus of claim 6, wherein:
   the azimuthal-adjustment lip comprises a plurality of arcuate adjustment apertures extending through the azimuthal-adjustment lip; and
   the apparatus further comprises a plurality of longitudinal fasteners, each fastener extending through a corresponding adjustment aperture, wherein an azimuthal position of said each fastener relative to the lead-in adapter determines an azimuthal alignment of the lead-in adapter in the nuclear magnetic resonance probe.

8. The apparatus of claim 1, wherein the lead-in adapter has a higher wear resistance than the azimuthal-alignment protrusion.

9. The apparatus of claim 1, wherein the sample container comprises a flow cell.

10. The apparatus of claim 1, wherein the sample container comprises a sample tube.

11. A nuclear magnetic resonance apparatus comprising:
    a nuclear magnetic resonance probe azimuthal-orientation adapter; and
    a sample container holder keyed into the azimuthal-orientation adapter, the sample container holder holding a transversely-elongated nuclear magnetic resonance sample container in a predetermined azimuthal orientation within a nuclear magnetic resonance probe.

12. The apparatus of claim 11, wherein the sample container holder comprises a transverse protrusion fitting in an aperture of the azimuthal-orientation adapter.

13. The apparatus of claim 11, wherein the azimuthal-orientation adapter comprises a transverse protrusion fitting in an aperture of the sample container holder.

14. A lead-in adapter for azimuthally orienting a nuclear magnetic resonance sample container in a nuclear magnetic resonance probe, the lead-in adapter comprising a longitudinal shell having an azimuthally-sloping upper guiding surface leading into a generally-longitudinal azimuthal-alignment channel sized to engage an azimuthal-alignment protrusion of a nuclear magnetic resonance sample container holder, an interior of the longitudinal shell defining a central longitudinal bore allowing a passage of the sample container held by the sample container holder.

15. A nuclear magnetic resonance measurement method comprising:
    positioning a nuclear magnetic resonance sample container in a predetermined azimuthal orientation in a nuclear magnetic resonance probe by keying-in a sample container holder holding the sample container into a nuclear magnetic resonance probe azimuthal-orientation adapter; and
    performing a nuclear magnetic resonance measurement on a sample contained in the sample container positioned in the azimuthal orientation.

16. The method of claim 15, wherein keying-in the sample container holder comprises:

sliding a transverse protrusion of a sample container holder down an azimuthally-sloping guiding surface of the azimuthal-orientation adapter, the guiding surface leading into a longitudinal channel formed in the azimuthal-orientation adapter; and sliding the transverse protrusion into the longitudinal channel.

17. The method of claim 15, further comprising adjusting an azimuthal orientation of the azimuthal-orientation adapter by controlling a positioning of a plurality of longitudinal fasteners-through a plurality of adjustment apertures defined in a transversely-protruding lip of the azimuthal-adjustment adapter.

18. The method of claim 17, further comprising evaluating a response of a nuclear magnetic resonance radio-frequency coil to the azimuthal orientation while adjusting the azimuthal orientation.

\* \* \* \* \*